United States Patent [19]

Adams et al.

[11] Patent Number: 5,979,771
[45] Date of Patent: Nov. 9, 1999

[54] APPARATUS TO VERIFY POSITION OF ELECTRICAL CONTACTS WITHIN A SLIDING SIM MECHANISM

[75] Inventors: Joel Quinn Adams, Pflugerville; David E. Bryant, Austin, both of Tex.

[73] Assignee: Siemens Information and Communication Networks, Inc., Boca Raton, Fla.

[21] Appl. No.: 08/943,630

[22] Filed: Oct. 3, 1997

[51] Int. Cl.$^6$ ........................................................ G06K 7/00
[52] U.S. Cl. .......................... 235/486; 235/441; 340/543; 340/815.43
[58] Field of Search ..................................... 235/439, 440, 235/441, 475, 476, 477, 481, 482, 486, 380; 340/500, 543, 815.45; 439/490; 379/357

[56] References Cited

U.S. PATENT DOCUMENTS

| | | | |
|---|---|---|---|
| 3,849,728 | 11/1974 | Evans | 324/762 |
| 4,382,228 | 5/1983 | Evans | 324/758 |
| 4,799,891 | 1/1989 | Reichardt et al. | 439/43 |
| 5,247,246 | 9/1993 | Van Loan et al. | 324/158 F |
| 5,336,877 | 8/1994 | Raab et al. | 235/475 |
| 5,670,884 | 9/1997 | Kodama | 439/489 |
| 5,760,592 | 6/1998 | Kodama et al. | 439/490 X |

*Primary Examiner*—Thien Minh Le
*Assistant Examiner*—Jared J. Fureman

[57] ABSTRACT

A SIM contact position tester (100) for verifying the position of SIM card contacts (c1–c8). A printed wiring board (102) is provided with traces (A–D) which correspond to the contacts (c1–c8) of the SIM card reader connector (101) and are configured to mate with the contacts of the SIM card reader connector (101) mounted within the radio telephone. A plurality of light emitting diodes (LED) (106) are coupled to the traces (A–D). The light emitting diodes (106) are configured to provide an indication of the position of the contacts (c1–c8) when the PWB (102) is positioned within the radio telephone. In one embodiment, the LEDs (106) sequentially light up as the printed wiring board (106) is moved into position over the contacts (c1–c8) of the SIM card reader connector (101).

14 Claims, 5 Drawing Sheets

APPARATUS TO VERIFY POSITION OF ELECTRICAL CONTACTS WITHIN A SLIDING SIM MECHANISM

BACKGROUND OF THE INVENTION

1. Field of the Invention

The present invention relates to a test apparatus and, more particularly, to a test apparatus for verifying the position of electrical contacts within a sliding SIM mechanism.

2. Description of the Related Art

Some radio telephone systems, such as digital cellular phone systems, employ IC cards, known as SIM (subscriber interface module) cards, which are inserted into a radio telephone for providing subscriber identification, billing information and other information concerning the operation of the radio telephone. For example, the SIM card might record the subscriber telephone number, a personal identification number, as well as call charge information or a telephone number index.

To transfer information between the SIM card and the radio telephone, a SIM card reader and connector is provided in the body of the radio telephone. The SIM card reader generally includes two rows of either four or three SIM card contacts which correspond to the contacts on the SIM card. When the SIM card is slid into the body of the cellular telephone, the SIM card's contacts mate with the SIM card reader contacts. In particular, typical SIM cards are slid into the SIM card slot until the leading edge of the SIM card hits a hard stop. A home switch is activated at or just before the point of the stop. Typically, the electronics are activated simultaneously with activation of the home switch. Thus, when the home switch is activated, the contacts in the SIM card reader must be guaranteed to be mating with the contact on the SIM card itself. The electrical interface can lock up if a proper connection is not assured. In addition, damage to the cards can result. Such lock ups and damage can result in dissatisfied customers and high rates of returns and higher costs.

Accordingly, there is a need for an improved method for insuring that the contacts on the SIM card reader are properly configured with respect to the SIM card contacts on the SIM card itself. More particularly, there is a need for accurately measuring the position of contacts within the SIM card reader relative to the home switch during the development process.

SUMMARY OF THE INVENTION

These and other drawbacks in the prior art are overcome in large part by an apparatus according to the present invention. A SIM contact position tester formed as a printed wiring board (PWB) is provided, dimensioned to be slidably received in or on a housing, such as within a slot on a radio telephone provided for a SIM card. The PWB is provided with traces or contact pads which correspond to the contacts of the SIM card reader connector, configured to mate with the contacts of the SIM card reader connector mounted within the radio telephone. A plurality of light emitting diodes (LED) are coupled to the traces. The light emitting diodes are configured to provide an indication of the position of the contacts when the PWB is positioned within the radio telephone. In one embodiment, the LEDs sequentially light up as the printed wiring board is moved into position over the contacts of the SIM card reader connector.

According to one embodiment of the invention, two sets of traces are employed: one for the leading row of contacts and one for the following row of contacts. Each set of traces further is paired with an offset set of traces such that resolution between traces is improved.

BRIEF DESCRIPTION OF THE DRAWINGS

A better understanding of the present invention is obtained when the following detailed description is considered in conjunction with the following drawings in which.

DETAILED DESCRIPTION OF THE INVENTION

Figure 1A:
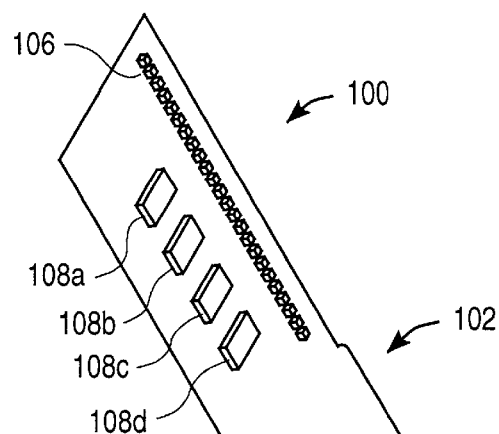
FIG. 1A and 1B are a diagram illustrating a cellular telephone and a SIM card contact tester according to the present invention.
Figure 1B:
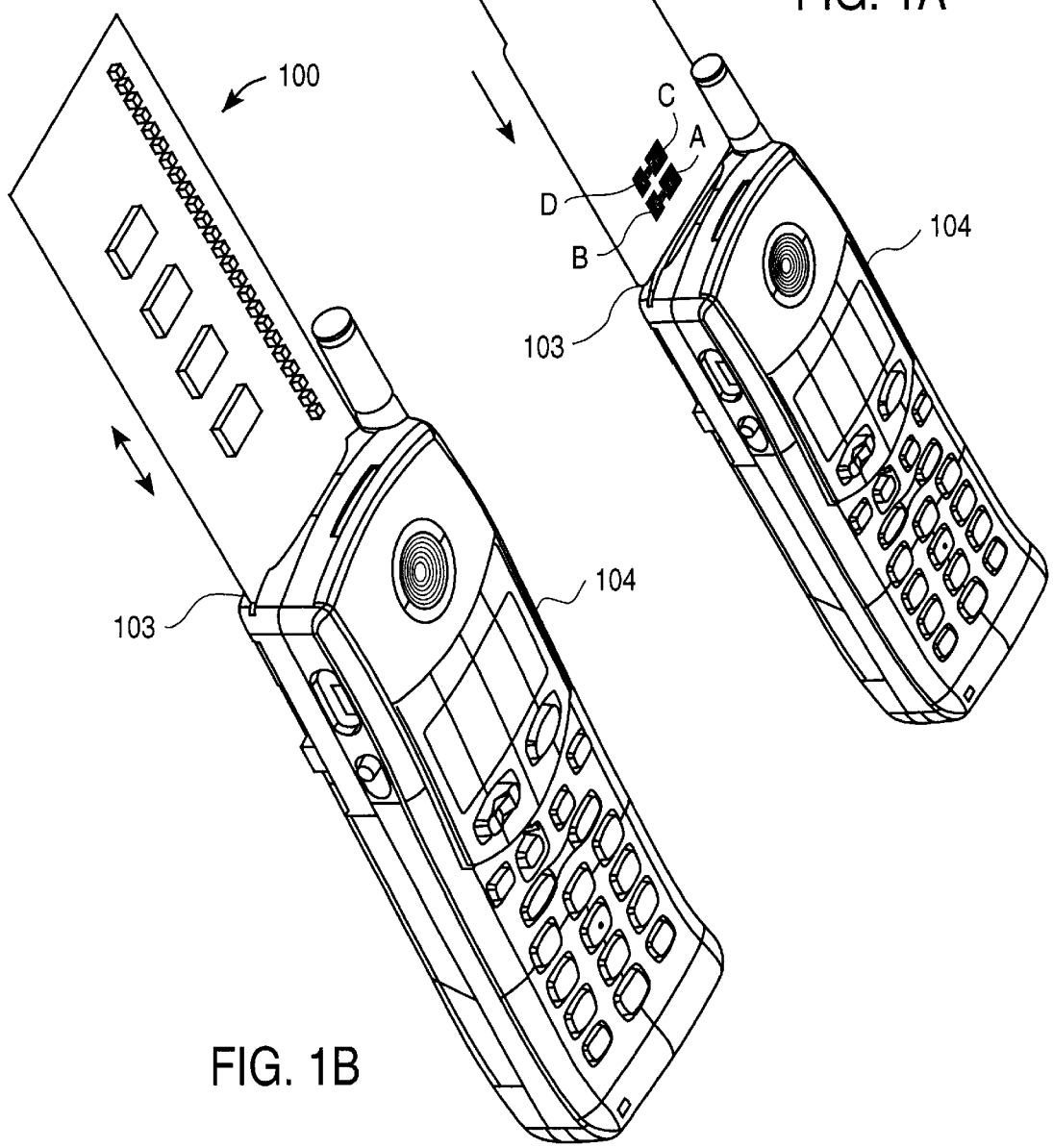

Referring to the drawings, and especially to FIGS. 1a and 1b, a radio telephone 104 and a SIM contact position tester embodying the present invention is shown therein and generally identified by the reference numeral 100. FIG. 1a illustrates the SIM contact position tester 100 prior to insertion into a conventional SIM card slot 103 of a housing 104 of, for example, a radio telephone. FIG. 1b illustrates the SIM contact position tester 100 as inserted into the radio telephone housing 104 via the slot 103.

As shown, the SIM contact position tester board 100 is formed from a printed wiring board (PWB) 102 having sets of traces A–D. A set of SIM card contacts c1–c8 on a SIM card connector interface 101 (FIG. 3) arranged in first and second rows 50, 52 are configured to match up with the PWB 102's traces (FIG. 4), as will be discussed in greater detail below. The PWB 102 is configured to be approximately the same width and thickness as a SIM card itself. For example, the PWB may be about 0.77 mm thick.

As will be explained in greater detail below, circuitry including a plurality of buffers embodied within integrated circuits 108a–108d couples the SIM card traces A–D and hence contacts c1–c8 with a plurality of light emitting diodes (LEDs) 106. In one embodiment, the buffers are Schmitt triggers embodied in, for example, 74HC14 integrated circuits. Pull down resistors on inputs of each buffer are used to prevent the inputs from floating up and turning on the LEDs 106. The LEDs 106 are configured to be lit up as the traces of each set A–D slide over the respective contacts internal to the radio telephone upon insertion of the PWB 102.

Figure 2:
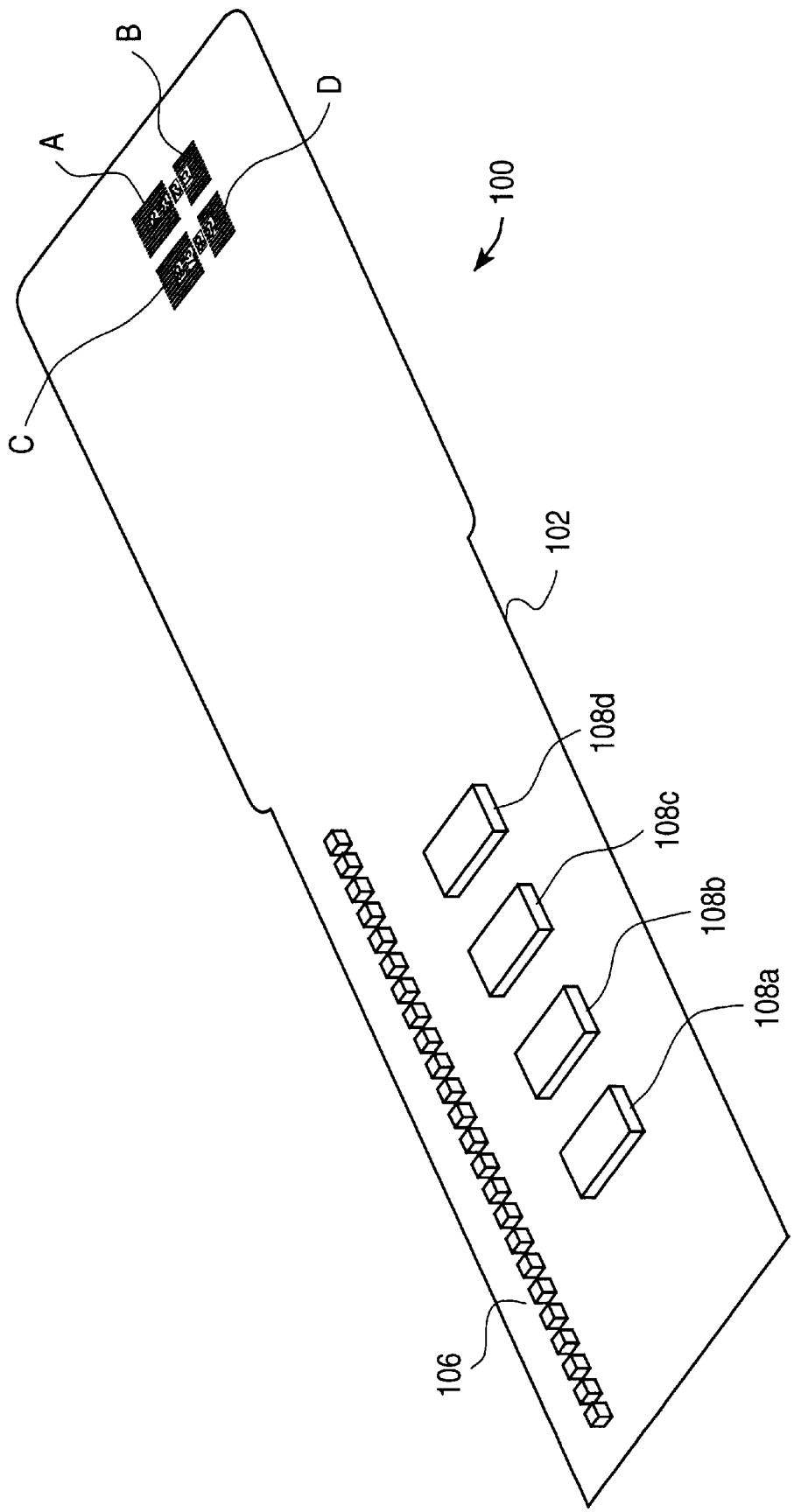
FIG. 2 is a diagram illustrating a SIM card contact tester according to an embodiment of the present invention.
Figure 4:
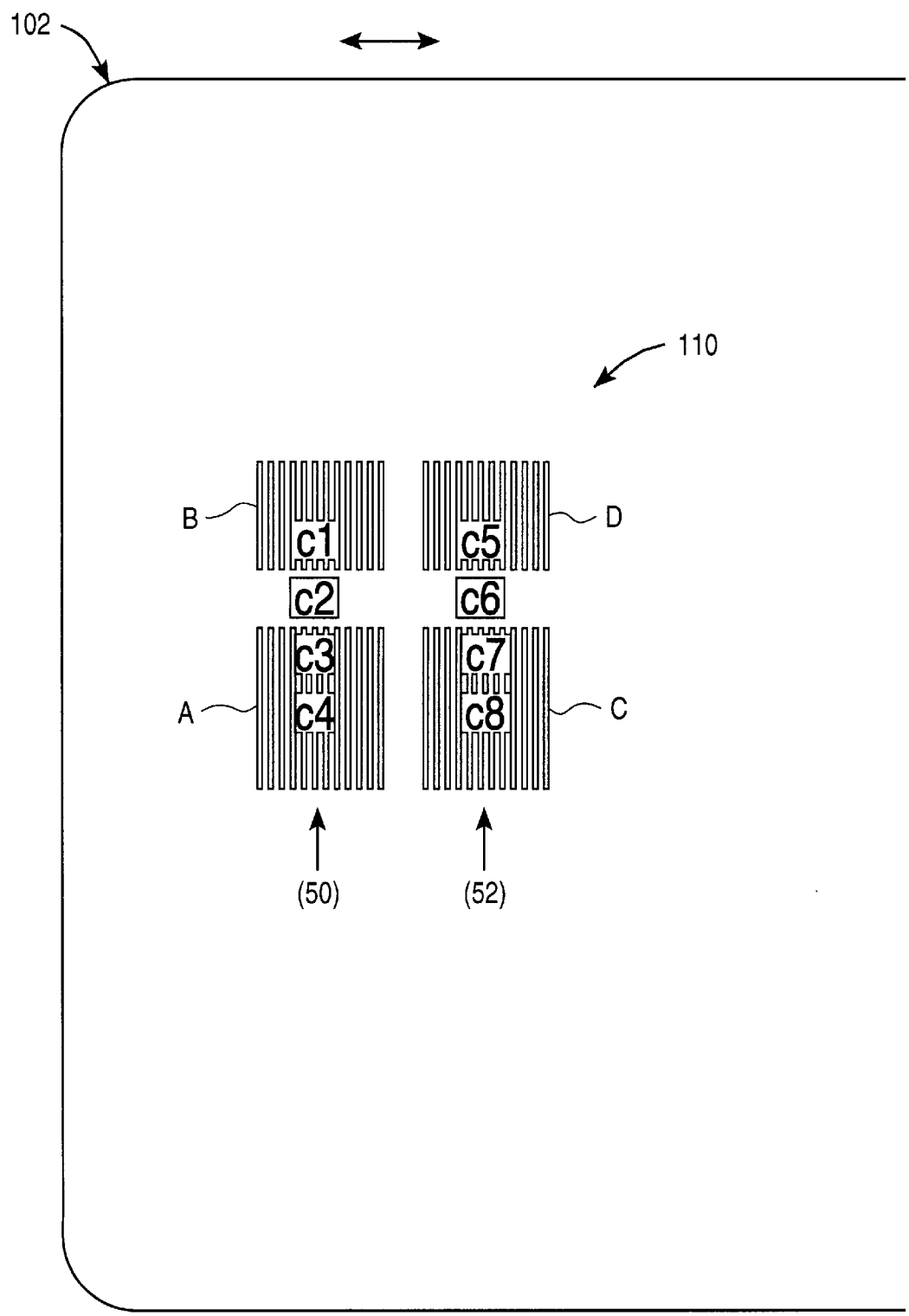
FIG. 4 is a diagram illustrating SIM card contacts and traces on a SIM card contact tester according to an embodiment of the present invention.

The traces A–D and contacts c1–c6 are illustrated more clearly in FIGS. 2 and 4. More particularly, as discussed above, eight SIM card interface contacts c1–c8 are configured to match up with the traces of trace sets A–D mounted on the PWB 102. It is noted that in other embodiments, only six SIM card contacts may be provided. Thus, the figures are exemplary only. However, the present invention may be used with either six or eight contact SIM interfaces.

In one embodiment, the traces of each set A–D are 0.01" wide and are spaced 0.01" apart. While the traces of sets C and D, and A and B could be positioned in-line with one another, in order to increase resolution, the traces of set A and B, and sets C and D, are offset from one another by 50%. By offsetting the pairs of traces a 0.01" resolution is achieved. It is noted that in alternate embodiments no offset or a different offset may be provided. It is similarly noted that the traces may be of any arbitrary width and have any arbitrary spacing. Thus, the figures are exemplary only.

As discussed above, the SIM contact position tester 100 is configured such that the PWB 102 is slid into the receiving slot 103 of the radio telephone in such a manner that contacts c5–c8 slide across trace sets A and B first, and then slide across the traces of trace sets C and D. This causes the corresponding LEDs of the LED bank 106 to light up.

Figure 3:
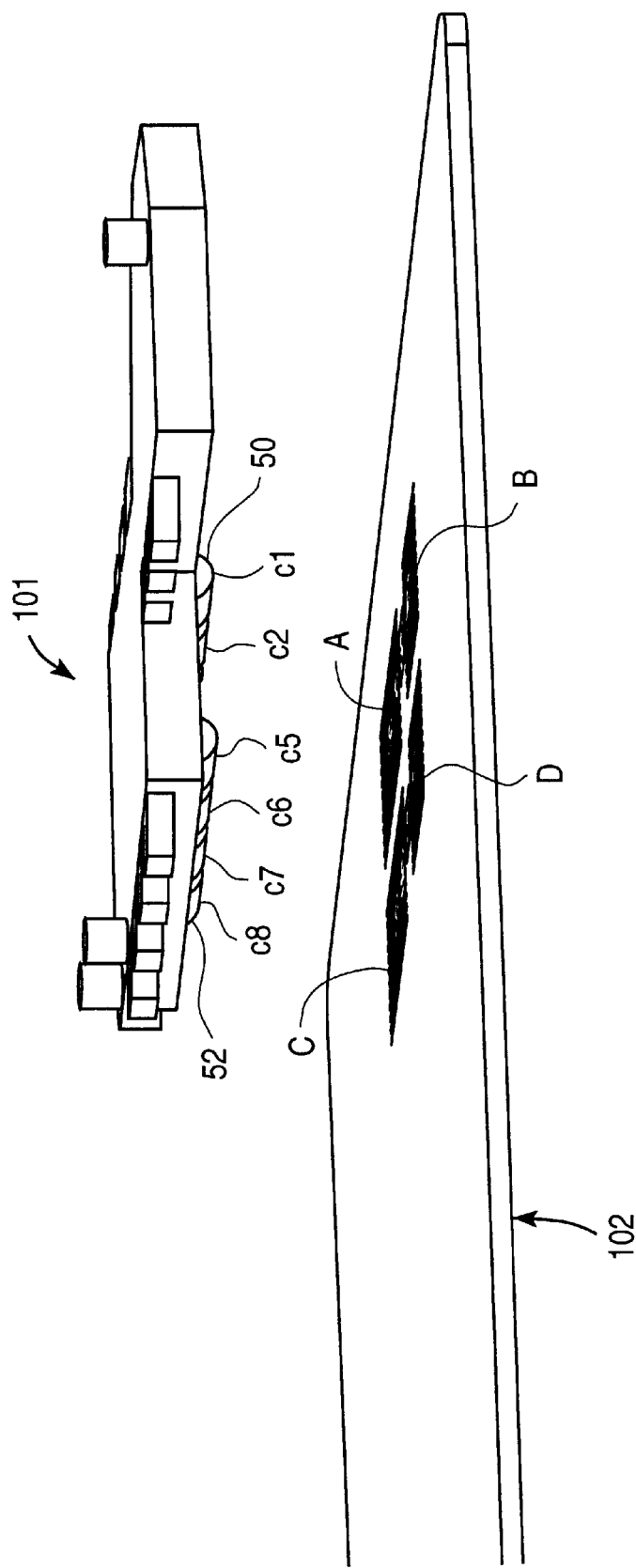
FIG. 3 is a diagram illustrating a SIM card contact tester and a SIM card reader connector according to an embodiment of the present invention.
Figure 5:
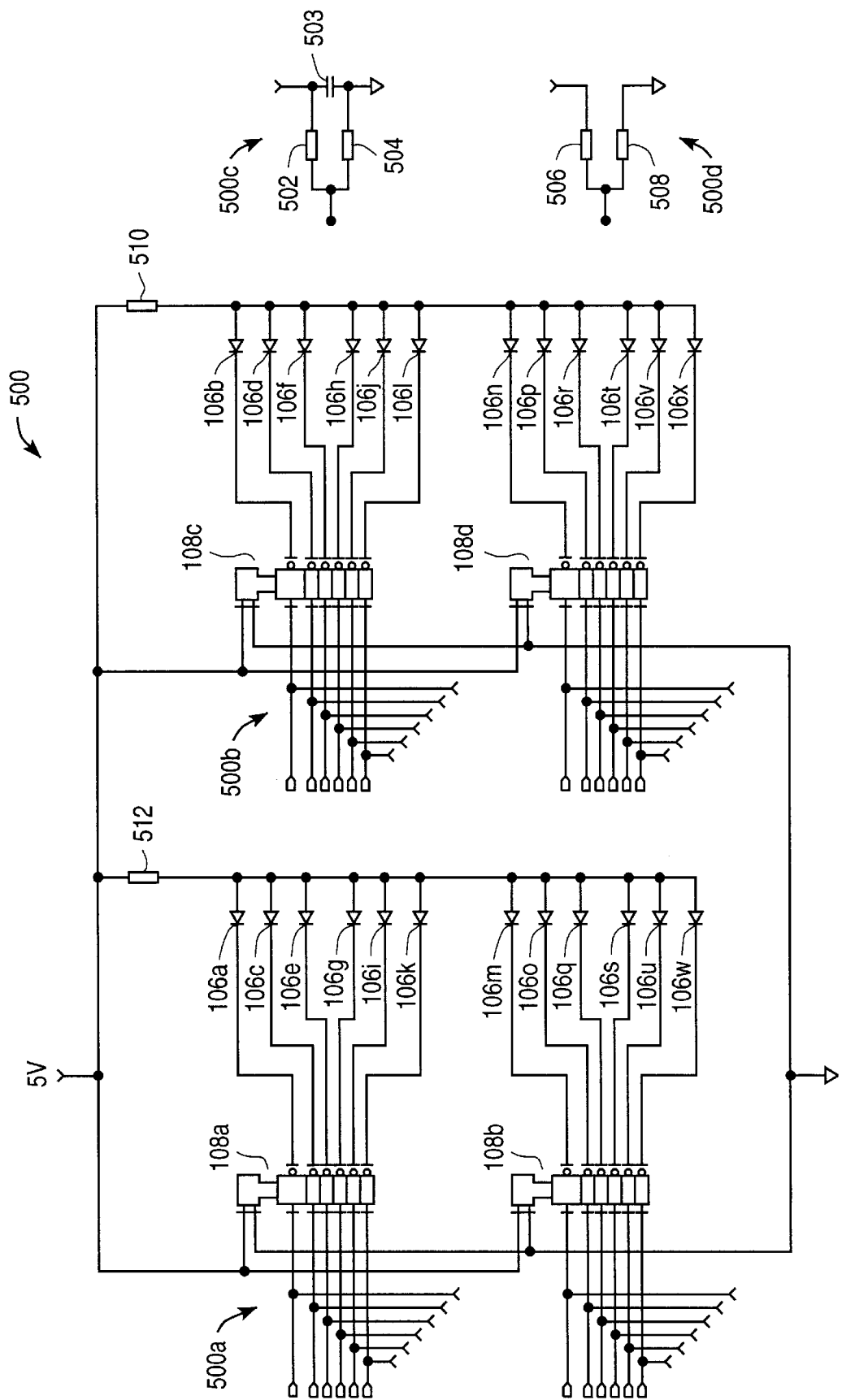
FIG. 5 is a circuit diagram illustrating an embodiment of the present invention.

This may be understood with reference to FIGS. 3–5. A SIM card interface 101 is shown in FIG. 3 as it would be positioned within the radio telephone housing 104 (FIG. 1). The SIM card interface 101 includes a row 52 of contacts c5–c8 and a row 50 of contacts c1–c4 (with contacts c3 and c4 hidden beneath the body of the SIM card interface 101). When the SIM contact position tester 100 is finally positioned in the radio telephone (not shown), the contacts c1–c4 mate with the traces of trace sets A and B, respectively, and the contacts c5–c8 mate with the traces of trace sets C and D, respectively, of the SIM contact position tester 100. FIG. 4 illustrates the placement of the contacts c1–c8 of the SIM card interface on the set of traces A–D according to this embodiment.

As can be appreciated, sliding the SIM contact position tester 100 into the slot 103 (FIG. 1) of the radio telephone 104 causes the traces of the trace sets A and B to first contact the contacts of the row 52 of contacts c5–c8 of the SIM card interface 101. In one embodiment, the LEDs are alternately coupled to traces of sets A and B (i.e., a1, b1, a2, b2, etc.) and C and D. As the SIM contact position tester 100 is further inserted into the slot 103, the traces of trace sets C and D come into contact with the bank 52 of contacts c5–c8, and the traces of trace sets A and B contact the bank 50 of contacts c1–c4. This can cause corresponding LEDs to sequentially light up.

The SIM contact position tester 100 is operable in two modes of operation. A first mode of operation is referred to as the modified SIM contact mode. In this mode of operation, the device under test is not operational. Only the mechanical configuration is tested. The SIM card interface 101 is modified by coupling together contacts c1 and c5 and c3 and c7, respectively. In this mode, sliding the SIM card test board 100 along the SIM card interface 101 causes the traces to move across the contacts and sequentially light the corresponding LEDs 106.

This may be seen with respect to FIG. 5, which illustrates the circuitry 500 which controls operation of the SIM contact position tester 100. The circuitry 500 includes four subcircuits 500A–500D, which correspond to trace sets A–D, respectively. The traces of trace set A are coupled via buffers 108a and 108b to the diodes 106a, c, g, i, and k, and 106 m, o, q, s u and w, respectively. The anodes of these diodes are coupled to a common source resistor 512, which in turn is coupled to receive 5 volts. The traces of trace set B in turn are coupled via buffers 108c and 108d to the diodes 106b, d, f, h, j and l, and 106n, p, r, t, v, and x, respectively. The anodes of these diodes are coupled to a common source resistor 510 which, again, is coupled to receive 5 volts.

However, according to an embodiment of the invention, no LEDs are lit in modified SIM contact mode until the SIM reader connector's contacts meet the traces of trace banks C and D. The subcircuit 500C is coupled to the traces of trace set C and the subcircuit 500D is coupled to the traces of trace set D. Subcircuits 500C and 500D essentially couple the traces of trace sets B and D together, and C and A together, respectively. More particularly, since the subcircuits 500C and 500D are coupled to 5 volts via resistors 502 and 506, respectively, and since contacts c5 and c7 are coupled to contacts c1 and c3, respectively, no LEDs light until the contacts c5 and c7 meet the traces of trace sets C and D.

In addition, by alternately coupling the diodes to a common source resistor, the SIM contact position tester 100 according to the present invention is able to take advantage of the relatively large width of the SIM card contact reader 101's contacts, as well as provide some interpolation of the system's resolution. More particularly, more than one diode can be lit at a time, since the SIM card connector reader 101's contacts are relatively wide. By connecting every other diode with a common source resistor, however, if one LED is lit, it will be at full brightness. If two are lit, they will both be at full brightness and the contact center point will be between them. If three LEDs become lit, then the middle LED will be at full brightness and the outer two LEDs will be half bright because they will be sharing the same source resistance. Thus, the center of the contact may be relatively accurately observed.

In the second mode of operation, referred to as the active mode of operation, the SIM card interface 101 is coupled to functional electronics in an active telephone. In this mode, the contacts c1, c5 and c3, c7 are not coupled to one another. Instead, advantage is taken of the internal configuration of the SIM card interface 101 and the radio telephone power supply. More particularly, the SIM card interface 101 provides power on one contact (for example, contact c1 provides 5 volts), but only after the home switch is activated. In this case, the traces of trace sets B and D, for example, which are in contact with the contacts c1 and c5, respectively, cause corresponding LEDs to light up. In this fashion, the location of the contacts at the home position becomes known. It is noted that, in this mode, only half resolution is possible, since power is supplied only to one pair of contacts.

The invention described in the above detailed description is not intended to be limited to the specific form set forth herein, but on the contrary, it is intended to cover such alternatives, modifications and equivalents as can reasonably be included within the spirit and scope of the appended claims.

What is claimed is:

1. A test apparatus for verifying the position of a plurality of electrical contacts on a card reader disposed on a housing without adjusting said housing, comprising:

a test board adapted to be removably received by said card reader; and a plurality of traces mounted on said test board and associated with each of a plurality of contacts on said card reader, said plurality of traces coupled to provide an indication of a location of where said contacts are in contact with said test board.

2. An apparatus according to claim 1, wherein said plurality of contacts comprise first and second rows of contacts.

3. An apparatus according to claim 2, wherein said plurality of traces comprises a first set of traces associated with a first contact of said first row of contacts and a second set of traces associated with a second contact of said second row of contacts.

4. An apparatus according to claim 3, wherein said plurality of traces comprises a third set of traces associated with a third contact of said first row of contacts and a fourth set of traces associated with a fourth contact of said second row of contacts.

5. An apparatus according to claim 4, wherein individual traces of said first set of traces and said third set of traces are partially offset from one another.

6. An apparatus according to claim 5, wherein said location indication is provided when said first and second contacts are in contact with traces of said first and second sets of traces, respectively.

7. An apparatus, comprising:
means including a plurality of contacts for reading an IC card; and
means electrically coupled to said reading means for determining a position of said plurality of contacts, wherein said determining means includes a printed wiring board having a plurality of sets of traces, a predetermined number of said sets corresponding to an associated predetermined number of said contacts.

8. An apparatus according to claim 7, wherein said reading means includes a subscriber interface module (SIM) card reader connector.

9. An apparatus according to claim 7, wherein said determining means is configured to be used with IC card readers of a first type and IC card readers of a second type.

10. An apparatus according to claim 9, wherein said IC card readers of said first type are six contact IC card readers.

11. An apparatus according to claim 9, wherein said IC card readers of said second type are eight contact IC card readers.

12. An apparatus, comprising:
means including a plurality of contacts for reading an IC card, said reading means including a subscriber interface module (SIM) card reader connector; and
means electrically coupled to said reading means for determining a position of said plurality of contacts, wherein said determining means includes a printed wiring board having a plurality of sets of traces, a predetermined number of said sets corresponding to an associated predetermined number of said contacts.

13. An apparatus according to claim 12, further comprising a plurality of light emitting diodes operably coupled to a predetermined number of said traces and configured to light up when said contacts are positioned over said traces.

14. An apparatus, comprising:
means including a plurality of contacts for reading an IC card; and
means electrically coupled to said reading means for determining a position of said plurality of contacts, wherein said determining means includes a first parallel set of traces partially offset from a second parallel set of traces.

* * * * *